United States Patent [19]
Naka et al.

[11] Patent Number: 5,941,775
[45] Date of Patent: *Aug. 24, 1999

[54] DATA PROCESSING SYSTEM, METHOD THEREOF AND MEMORY CASSETTE

[75] Inventors: Yuji Naka; Susumu Nishikita, both of Tokyo, Japan

[73] Assignee: Sega of America, Inc., Redwood City, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/542,992

[22] Filed: Oct. 13, 1995

Related U.S. Application Data

[63] Continuation-in-part of application No. 08/324,349, Oct. 17, 1994, abandoned.

[30] Foreign Application Priority Data

Oct. 14, 1994 [JP] Japan ................................. 6-249315

[51] Int. Cl.⁶ .......................................... A63F 9/22
[52] U.S. Cl. ........................................ 463/44; 273/148 B
[58] Field of Search ..................... 273/148 B; 463/44, 463/43

[56] References Cited

U.S. PATENT DOCUMENTS

| | | | |
|---|---|---|---|
| Re. 33,559 | 3/1991 | Fallacaro et al. ................... | 358/335 |
| Re. 34,161 | 1/1993 | Nakagawa et al. ................. | 273/85 |
| D. 219,929 | 2/1971 | Warner ............................... | D34/5 |
| D. 285,926 | 9/1986 | Kies et al. .......................... | D14/114 |
| D. 308,197 | 5/1990 | Inoue .................................. | D14/114 |

(List continued on next page.)

FOREIGN PATENT DOCUMENTS

| | | | |
|---|---|---|---|
| 1 346 219 | 10/1971 | European Pat. Off. ........ | G11C 17/00 |
| 1 491 702 | 5/1974 | European Pat. Off. ........ | G11C 29/00 |
| 1 550 675 | 7/1976 | European Pat. Off. ......... | G11C 8/00 |
| 1 531 528 | 10/1976 | European Pat. Off. ........ | G06F 11/00 |
| 0265227 A2 | 10/1987 | European Pat. Off. ......... | G11C 5/00 |
| 0265905 A2 | 10/1987 | European Pat. Off. ........ | G06F 12/06 |
| 0 268 419 A2 | 5/1988 | European Pat. Off. ........ | G06F 12/06 |
| 78 30641 | 10/1978 | France ............................ | G06F 15/44 |
| 2220684 A2 | 2/1989 | Japan ................................ | A63F 9/22 |
| 2220685 A2 | 2/1989 | Japan ................................ | A63F 9/22 |
| 671049 | 3/1994 | Japan ..................................... | 273/435 |
| 1423698 | 10/1973 | United Kingdom ............... | G11C 7/00 |
| 2 115 989 | 10/1982 | United Kingdom ........... | H01R 33/94 |
| 2 129 585 | 10/1982 | United Kingdom ............ | G06F 11/20 |
| 2 118 809 | 11/1982 | United Kingdom .............. | A63F 9/22 |
| 2215497 | 9/1988 | United Kingdom ............ | G06F 12/00 |

OTHER PUBLICATIONS

Logan, Ian, *Spectrum Micro Drive Book*, pp. 1–7, Melbourne House Publishers, 1983.

(List continued on next page.)

*Primary Examiner*—Michael O'Neill
*Attorney, Agent, or Firm*—Dergosits & Noah LLP

[57] ABSTRACT

The present invention aims at providing a data processing system which can realize a variety of process. A secondary memory cassette 31 includes a connector 32 which can be connected to both a primary memory cassette 21 or a processing device body, and address transfer circuit 39 which judges whether the connector has been connected to the primary memory cassette 21 based upon the connection state of the connector and outputs an address transfer signal, and a memory 38 which outputs data corresponding to the address transfer signal and the address signal supplied from connector 32. The primary memory cassette 21 includes a mask ROM 28, a connector 22 for connection with the processing device body, and a connector 24 which can be connected with the secondary memory cassette 31. A predetermined pin of connector 24 is connected to a ground.

When primary memory cassette 21 is connected with secondary memory cassette 31, signal Sa becomes level L, so that address transfer circuit 39 changes the memory allocation of ROM 38.

15 Claims, 11 Drawing Sheets

U.S. PATENT DOCUMENTS

| | | |
|---|---|---|
| D. 311,737 | 10/1990 | Westwood et al. .................... D14/114 |
| D. 315,577 | 3/1991 | Wang ........................ D21/43 |
| 3,803,470 | 4/1974 | Vosteen ................... 318/331 |
| 4,095,791 | 6/1978 | Smith et al. .............. 273/85 |
| 4,149,027 | 4/1979 | Asher ....................... 174/52 |
| 4,177,462 | 12/1979 | Chung ..................... 340/703 |
| 4,179,178 | 12/1979 | Bachman et al. ........ 339/111 |
| 4,180,805 | 12/1979 | Burson .................... 340/709 |
| 4,232,374 | 11/1980 | Chung ..................... 364/900 |
| 4,354,258 | 10/1982 | Sato ........................ 365/230 |
| 4,368,515 | 1/1983 | Nielsen ................... 364/200 |
| 4,386,773 | 6/1983 | Bronstein ................. 273/1 |
| 4,394,055 | 7/1983 | Smith ..................... 312/196 |
| 4,420,794 | 12/1983 | Anderson ................ 361/419 |
| 4,432,067 | 2/1984 | Nielsen ................... 364/900 |
| 4,483,835 | 11/1984 | Williams ................ 273/148 |
| 4,485,457 | 11/1984 | Balaska et al. ........ 364/900 |
| 4,498,079 | 2/1985 | Ghosh .................... 340/725 |
| 4,516,777 | 5/1985 | Nikora ................... 273/148 |
| 4,531,176 | 7/1985 | Beecher, II ............ 361/424 |
| 4,569,528 | 2/1986 | Fanti ..................... 273/267 |
| 4,579,338 | 4/1986 | Heffron .................. 273/1 |
| 4,593,378 | 6/1986 | McWhirter et al. .... 364/900 |
| 4,596,390 | 6/1986 | Studley .................. 273/148 |
| 4,620,707 | 11/1986 | Lippincott ............. 273/148 |
| 4,623,147 | 11/1986 | Ackerman et al. ..... 273/1 |
| 4,628,304 | 12/1986 | Bottiau ................... 340/703 |
| 4,654,787 | 3/1987 | Finnell et al. .......... 364/200 |
| 4,666,160 | 5/1987 | Hamilton ................ 273/242 |
| 4,679,167 | 7/1987 | Finnell ................... 364/900 |
| 4,695,953 | 9/1987 | Blair et al. ............. 364/410 |
| 4,763,300 | 8/1988 | Yukawa .................. 365/52 |
| 4,771,344 | 9/1988 | Fallacaro et al. ...... 358/335 |
| 4,793,818 | 12/1988 | Poirer .................... 439/140 |
| 4,844,465 | 7/1989 | Hibino et al. .......... 148/273 |
| 4,858,930 | 8/1989 | Sato ....................... 273/85 |
| 4,860,128 | 8/1989 | Nakagawa ............. 360/60 |
| 4,864,458 | 9/1989 | Demorat, Jr. et al. ... 361/212 |
| 4,872,091 | 10/1989 | Maniwa et al. ........ 361/424 |
| 4,922,420 | 5/1990 | Nakagawa et al. ..... 364/410 |
| 4,926,372 | 5/1990 | Nakagawa .............. 364/900 |
| 4,941,841 | 7/1990 | Darden et al. .......... 439/377 |
| 4,949,298 | 8/1990 | Nakanishi et al. ..... 364/900 |
| 4,984,193 | 1/1991 | Nakagawa .............. 364/900 |
| 5,004,232 | 4/1991 | Wong et al. ........... 273/435 |
| 5,006,959 | 4/1991 | Freige et al. ........... 361/384 |
| 5,026,051 | 6/1991 | Lowe et al. ............ 273/435 |
| 5,052,685 | 10/1991 | Lowe et al. ............ 273/460 |
| 5,061,845 | 10/1991 | Pinnavaia .............. 235/492 |
| 5,070,479 | 12/1991 | Nakagawa .............. 395/575 |
| 5,076,584 | 12/1991 | Openiano ............... 273/148 |
| 5,077,684 | 12/1991 | Kitajima ................ 395/275 |
| 5,096,798 | 3/1992 | Kanbe et al. ........... 430/120 |
| 5,112,051 | 5/1992 | Darling et al. ......... 273/148 |
| 5,119,497 | 6/1992 | Freige et al. ........... 395/750 |
| 5,134,391 | 7/1992 | Okada .................... 340/799 |
| 5,140,110 | 8/1992 | Nakagawa et al. ..... 174/250 |
| 5,155,663 | 10/1992 | Harase ................... 361/395 |
| 5,161,803 | 11/1992 | Ohara .................... 273/435 |
| 5,193,818 | 3/1993 | Leeson ................... 273/430 |
| 5,203,848 | 4/1993 | Wang ..................... 273/435 |
| 5,226,136 | 7/1993 | Nakagawa .............. 395/425 |
| 5,238,250 | 8/1993 | Leung et al. ........... 273/435 |
| 5,357,621 | 10/1994 | Cox ........................ 395/400 |
| 5,362,068 | 11/1994 | Liu ......................... 273/435 |
| 5,395,112 | 3/1995 | Darling .................. 273/148 B |
| 5,423,555 | 6/1995 | Kidrin ................... 273/434 |

OTHER PUBLICATIONS

*Your Sinclair* Magazine, pp. cover, 109, 113, 114, Dennis Publishing, Ltd., London, (no date).

*ZZAP!* Magazine, A Newsfield Publication, vol. 42, Oct. 1988.

*ZZAP!* Magazine, A Newsfield Publication, vol. 45, Jan. 1989.

*Action Reply—The Ultimate Backup Cartridge*, Instruction Manual, pp. 1–24, Datal Electronics, 1988.

A copy of a European Search Report for a corresponding foreign application no GB 9521049.8.

| CHIP SELECT SIGNAL *CS | ADDRESS *ax | CHIP SELECT SIGNAL CSa | CHIP SELECT SIGNAL CSb |
|---|---|---|---|
| "0" | "0" | "0" | "1" |
| "0" | "1" | "1" | "0" |
| "1" | X | "1" | "1" |

DATA PROCESSING SYSTEM, METHOD THEREOF AND MEMORY CASSETTE

RELATED APPLICATION DATA

This application ia continuation-in-part of patent application Ser. No. 08/324,349 to Naka, entitled Two Part Cartridge System for Use with Game Console, filed in Oct. 17, 1994 now abandoned.

TECHNICAL FIELD

The present invention relates to a data processing system comprising a processing apparatus which conducts the processing of information such as the execution of programs and the use of data by installing a memory cassette therein with programs and data stored thereon, a memory cassette structure used for this system and the data processing method of this system.

BACKGROUND OF THE INVENTION

These types of data processing systems are known as comprising a memory cassette with programs and data stored thereon, and an operator (processing device) having a connector for connection to this memory cassette, and executing the cassette programs by connection of such memory cassette to this connector. A typical data processing system of this kind is a system for game machines. As is well known, game machines execute game programs by installation of a memory cassette therein with programs and data for various games stored thereon. Generally provided game machines further comprise a game machine body for using such data, and a controller giving various operating commands (operating signals) to the game machine body, which enables indication of the processed matter inside the game machine body on television receivers and the like.

These kinds of memory cassettes are constructed so as to have a connector on one side of the box-shaped cassette body and to comprise a ROM and its peripheral circuits inside the cassette body. A memory cassette with this kind of structure has a substantially constant cassette body volume, thereby inevitably determining the storage capacity of the ROM. This determines the capacity of programs storable in the ROM, leading to demand for greater program capacity.

Therefore, a compact connector provided on the body of the memory cassette offers a game machine which enables the installation of a new compact ROM cassette on this compact connector. This game machine is constructed such as to enable the installation of a memory cassette with a compact connector provided thereon in the game machine body. By installing a compact ROM on the compact connector of the memory cassette, it is possible to use the data stored in the compact ROM with the game machine body.

However, these game machines merely use the data in the compact ROM cassette without any change in the development of the game itself, which would not completely satisfy demands for development of a variety of games.

The development of various games and realization of other various processes require a large amount of programs and a great memory capacity for storing a great amount of programs. However, conventional game machines had the disadvantage that the memory capacity of the cassette body was inevitably limited in consideration of transportation, handling or price, etc.

Further, conventional game machines could not re-use games developed in the past inside new game programs, so that the non-use of old programs led to the waste of development steps, the ROM and other resources spent for the development of such program.

Therefore, the present invention aims at solving these problems by providing a data processing system which can realize a variety of processes and which can effectively use resources. Another purpose is to provide a novel memory cassette structure for use with this system.

SUMMARY OF THE INVENTION

In order to overcome these problems, the data processing system according to claim 1 is a data processing system comprising a processing device body for performing the process based on the stored contents of memory cassettes, a primary memory cassette which is connectable to said processing device body, and, a secondary memory cassette which is connectable to either said primary memory cassette or said processing device body, wherein when either the primary memory cassette or the secondary memory cassette is connected to the processing device body, data is read from such memory cassette in a first address range, and wherein when the processing device body is connected to the primary memory cassette which is then connected to the secondary memory cassette, data is read in a wider address range, which includes a second address range which does not overlap with the first address range.

The memory cassette according to claim 2 is a memory cassette which is said secondary memory cassette used for said data processing system according to claim 1, comprising a connector which is electrically connectable to either a connector of said primary memory cassette or said processing device body, a connection state judging circuit which judges by the connection state of the connector whether the connector has been connected to the primary memory cassette and outputs an address transfer signal corresponding to such connection state, and, a memory for outputting data corresponding to the address transfer signal supplied from the connection state judging circuit and to the address signal supplied from the connector.

The memory cassette according to claim 3 is a memory cassette according to claim 2, wherein when said connection state judging circuit judges that said connector has been connected to said primary memory cassette, the connection state judging circuit outputs said address transfer signal in order to transfer the address range for reading data from the memory to said second address range which does not overlap with said first address range for reading the data from the memory of the primary memory cassette.

The memory cassette according to claim 4 is a memory cassette according to claim 2, wherein when the signal logic of one predetermined pin of a plurality of pins constituting said connector becomes a predetermined signal logic, said connection state judging circuit judges that the connector has been connected to another memory cassette.

The memory cassette according to claim 5 is a memory cassette which is said primary memory cassette used for said data processing system according to claim 1 and which is connectable to the memory cassette according to claims 2, 3 and 4 as said secondary memory cassette, comprising a first connector which is electrically connectable to said processing device body, a memory for outputting data corresponding to an address signal supplied from the processing device body when connected to the processing device body via the first connector, and, a second connector which is connectable to the secondary memory cassette and which is provided so that the address signal supplied from the processing device body via the first connector is transmittable, wherein one predetermined pin of a plurality of pins constituting the second connector is retained at a predetermined signal logic.

The memory cassette according to claim 6 is a memory cassette which is said secondary memory cassette used for said data processing system according to claim 1, comprising a connector which is electrically connectable to a connector of said primary memory cassette, and a memory for outputting data corresponding to an address signal supplied from the connector, wherein one predetermined pin of a plurality of pins constituting the connector is retained at a predetermined signal logic.

The memory cassette according to claim 7 is a memory cassette which is said primary memory cassette used for said data processing system according to claim 1, and which is connectable to said memory cassette according to claim 6 as said secondary memory cassette, comprising a first connector which is electrically connectable to said processing device body a second connector which is connectable to the secondary memory cassette and which is provided so that an address signal supplied from the processing device body via the first connector is transmittable a connection state judging circuit which judges by the connection state of the second connector whether the secondary memory cassette has been connected to the second connector and outputs an address transfer signal corresponding to such connection state, and a memory for outputting data corresponding to the address transfer signal supplied from the connection state judging circuit and to the address signal supplied from the first connector.

The memory cassette according to claim 8 is a memory cassette according to claim 7, wherein when said connection state judging circuit judges that said second connector has been connected to said secondary memory cassette, said connection state judging circuit outputs said address transfer signal in order to transfer the address range for reading data from the memory of such primary memory cassette to said second address range which does not overlap with said first address range for reading data from the memory of the secondary memory cassette.

The memory cassette according to claim 9 is a memory cassette according to claim 7, wherein when the signal logic of one predetermined pin of a plurality of pins constituting said second connector becomes a predetermined signal logic, said connection state judging circuit judges that the connector has been connected to said secondary memory cassette.

The memory cassette according to claim 10 is a memory cassette which is said secondary memory cassette used for said data processing system according to claim 1, comprising a connector which is electrically connectable to said primary connector, and a memory for outputting data corresponding to said address signal supplied from the connector, wherein a lead extending from one predetermined pin of a plurality of pins constituting the connector is connected to a chip select terminal of the memory.

The memory cassette according to claim 11 is a memory cassette which is said primary memory cassette used for said data processing system according to claim 1, and which is connectable to the memory cassette according to claim 10 as said secondary memory cassette, comprising a first connector which is electrically connectable to said processing device body, a second connector which is connectable to the secondary memory cassette and which is provided such that said address signal supplied from the processing device body via the first connector is transmittable, a connection state judging circuit which, based on a certain address signal supplied from the first connector, outputs a first chip select signal which becomes effective when the address signal is within said first address range, and outputs a second chip select signal which becomes effective when the address signal is within said second address range to a predetermined pin of the second connector, and a memory for outputting data corresponding to the first chip select signal supplied from the connection state judging circuit and to the address signal supplied from the first connector.

The memory cassette according to claim 12 is a memory cassette according to one of claims 5, 7, 8, 9 or 11, wherein the memory cassette has a three-dimensional construction comprising two opposing faces, and said first connector and said second connector are provided on the opposing faces, respectively.

The data processing method according to claim 13 is a data processing method employing a processing device body performing the process based on the stored contents of memory cassettes, a primary memory cassette which is connectable to said processing device body, and a secondary memory cassette which is connectable to either the primary memory cassette or the processing device body, wherein when it is judged that either the primary memory cassette or the secondary memory cassette is connected to the processing device body, data is read from such memory cassette in said first address range, and wherein when it is judged that the processing device body is connected to the primary memory cassette which is then connected to the secondary memory cassette, data is read in a wider address range, which includes said second address range which does not overlap with the first address range.

Therefore, as it is possible to use the primary and secondary memory cassettes alone or jointly, the demands for a variety of game developments are satisfied. Further, by the use of two memory cassettes, it is possible to use programs using a large amount of memory capacity. Moreover, as it is possible to re-use old games, the effect is achieved that the steps of development, ROM and other resources for such game are effectively utilized.

DETAILED DESCRIPTION OF THE INVENTION

Now, embodiments of the present invention will be described with reference to the drawings.

Figure 1:
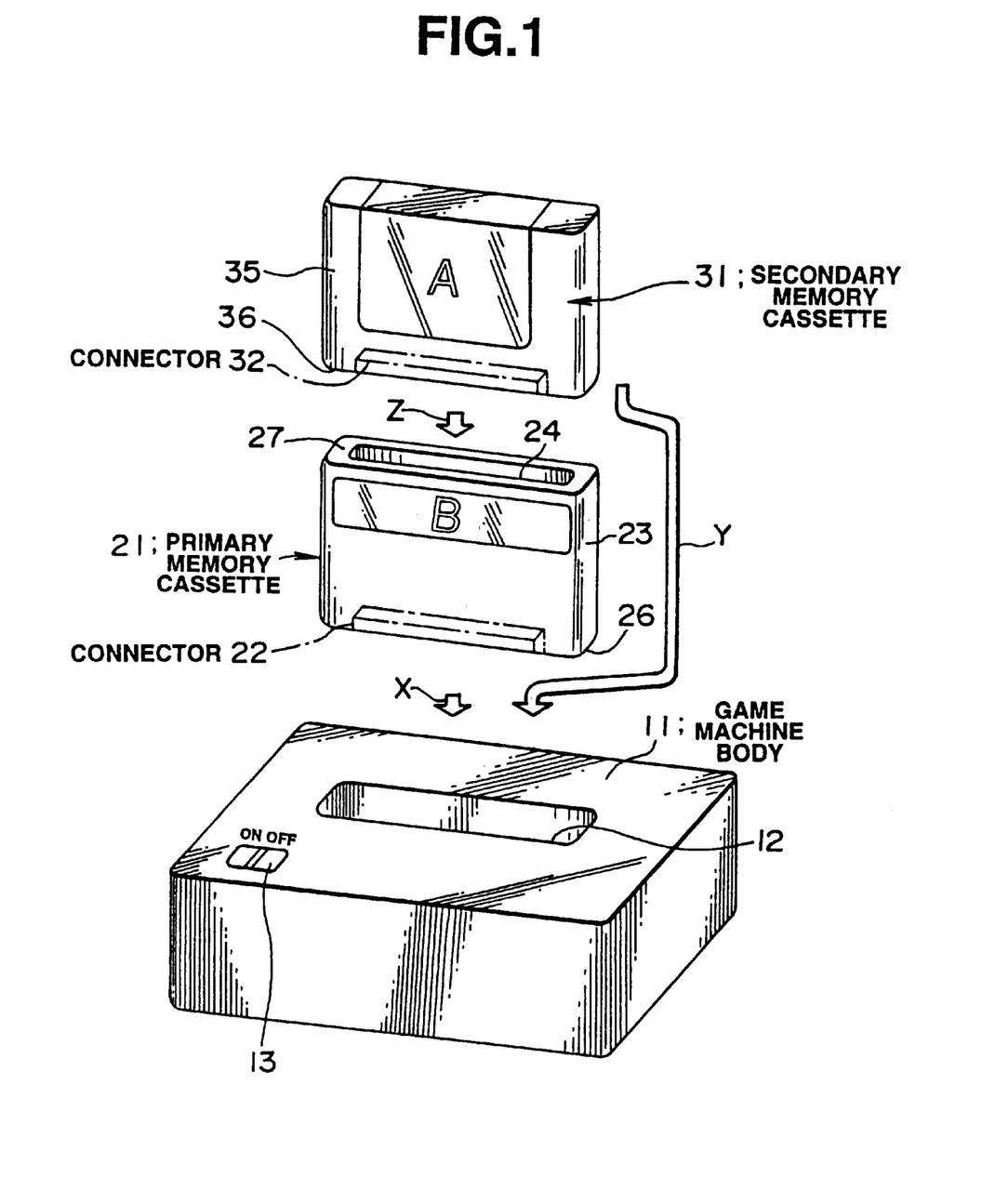
FIG. 1 A perspective view of the structure of an embodiment of the data processing system according to the present invention and the memory cassette used for this system.

FIG. 1 is a perspective view of an embodiment of the data processing system according to the present invention and the memory cassette structure used for this system.

The data processing system indicated in FIG. 1 has as its composing elements a game machine body 11, a primary memory cassette 21 and a secondary memory cassette 31. On connector 12 of game machine body 11, a connector 22 of primary cassette 21 may be installed as shown by arrow X, and a connector 32 of secondary cassette 31 may be installed as shown by arrow Y.

Further, on the surface of body 23 of primary memory cassette 21 which is opposite to connector 22 (shown as the upper surface), connector 24 is arranged which is identical to connector 12 provided on game machine body 11, and enables the installation of connector 32 of secondary cassette 31 on connector 24 as shown by arrow Z.

When connector 22 of primary memory cassette 21 is installed on connector 12 of game machine body 11 as shown by arrow X, and connector 32 of secondary memory cassette 31 is installed on connector 24 of primary cassette 21 as shown by arrow Z, game machine body 11 is in a state to be able to use the game programs of both the primary cassette 21 and the secondary cassette 31.

For enabling use of the programs of both memory cassettes 21, 31 with game machine body 11, a structure is provided on the interior of such primary memory cassette 21 or secondary memory cassette 31 for sharing addresses. This structure becomes operative when connector 22 of primary cassette 21 is installed on connector 12 of such game machine body 11 and connector 32 of secondary cassette 31 is installed on connector 24 of primary cassette 21. In this way, one of the addresses of the memory address ranges of memory cassettes 21, 31 is transferred and used.

Now, each element of such data processing system will be described in detail. As shown in the drawings, game machine body 11 of the present embodiment has a parallelepiped shape wherein the length is somewhat smaller than the width and the height is around 1/20 of the length. Connector 12 is provided on the upper surface of this 3-dimensional body, and switch 13 is provided on the left lower side of the upper surface, as shown.

Primary memory cassette 21 comprises a thin parallelepiped housing 23. Connector 22 is provided on bottom 26 of this housing 25, and on the upper surface 27 (the face opposite to said bottom face) of this housing 25, connector 24 is provided which has the same structure as connector 12 of game machine body 11 is provided.

Further, secondary cassette 31 comprises a thin parallelepiped housing 35, and connector 32 is provided on bottom 36 of housing 35. This structure enables the installation of connector 32 of secondary cassette 31 on connector 12 of game machine body 11 and to connector 24 of the primary cassette 21, too.

Figure 2:
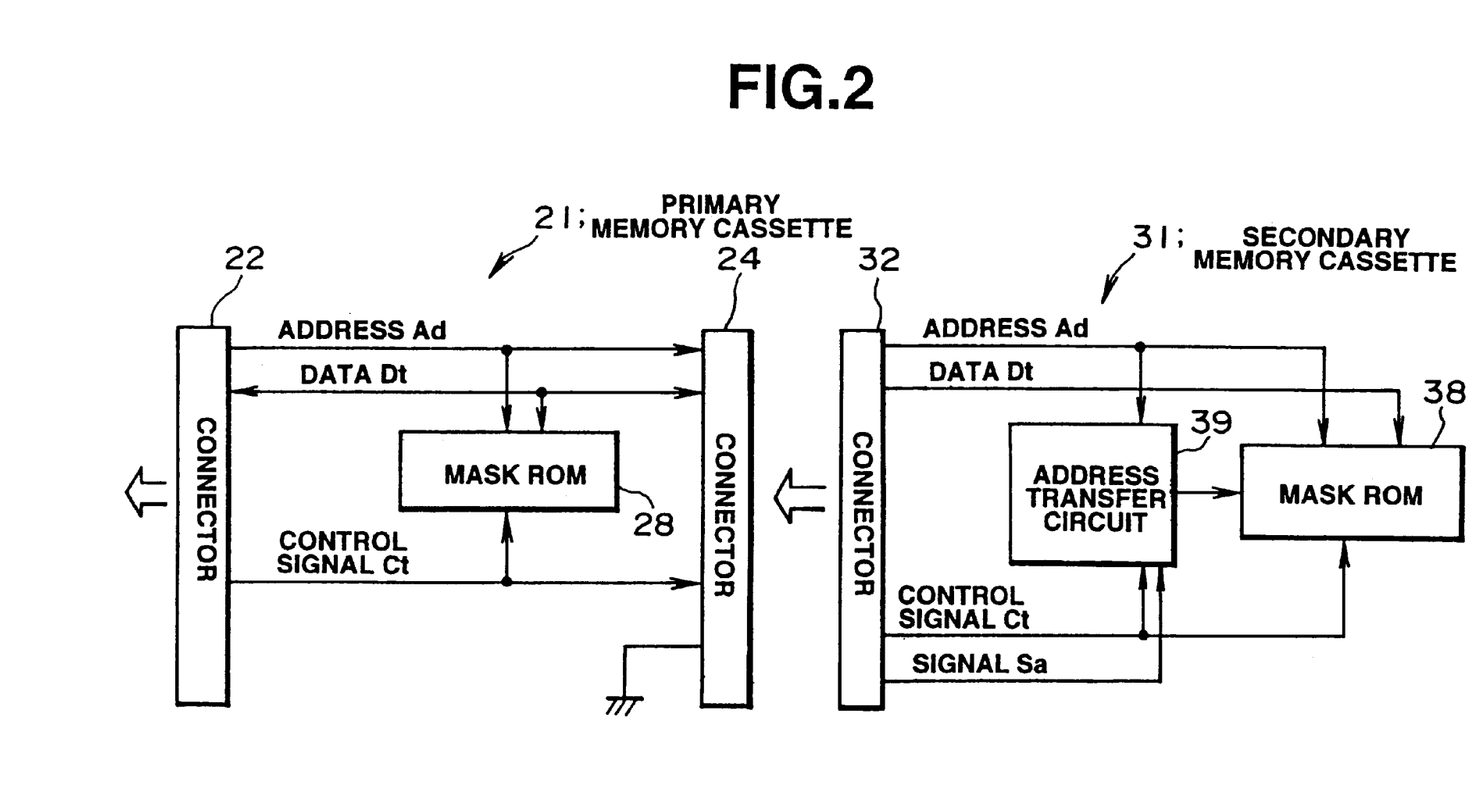
FIG. 2 A block diagram of the circuits of a primary memory cassette and a secondary memory cassette to be used such embodiment.

FIG. 2 is a circuit diagram of the primary and the secondary memory cassette used in an embodiment of the system relating to the present invention.

In FIG. 2, the circuit system of primary memory cassette 21 comprises a connector 22, a connector 24 and a mask ROM 28. Those connectors 22 and connectors 24 which have the same pin numbers are connected to each other as signal wires for address Ad, data Dt and control signal Ct. The wiring for address Ad, data Dt and control signal Ct is constructed so as to be connected to mask ROM 28.

Further, at primary memory cassette 21, connector 24 with a predetermined pin number is connected to the grounding electrode. When connector 32 of secondary cassette 31 is connected with connector 24 of primary cassette 21, it comes into contact with the grounding electrode of connector 24. A pin inside connector 24 is grounded. Accordingly, the signals taken from a pin of this connector 24 are signals Sa indicating connection of secondary cassette 31 to primary cassette 21.

Further, in the circuit system of secondary cassette 31, a connector 32, a mask ROM 38 and an address transfer circuit 39 as a connection state judging means are arranged. Address Ad, data Dt and control signal Ct, respectively, of connector 32 with a predetermined pin number is connected to a predetermined pin of mask ROM 38, and address Ad and control signal Ct and signal Sa are connected to a predetermined electrode of address transfer circuit 39. The address transfer signals generated by address transfer circuit 39 are supplied to the address changing input terminal of mask ROM 38.

Figure 3:
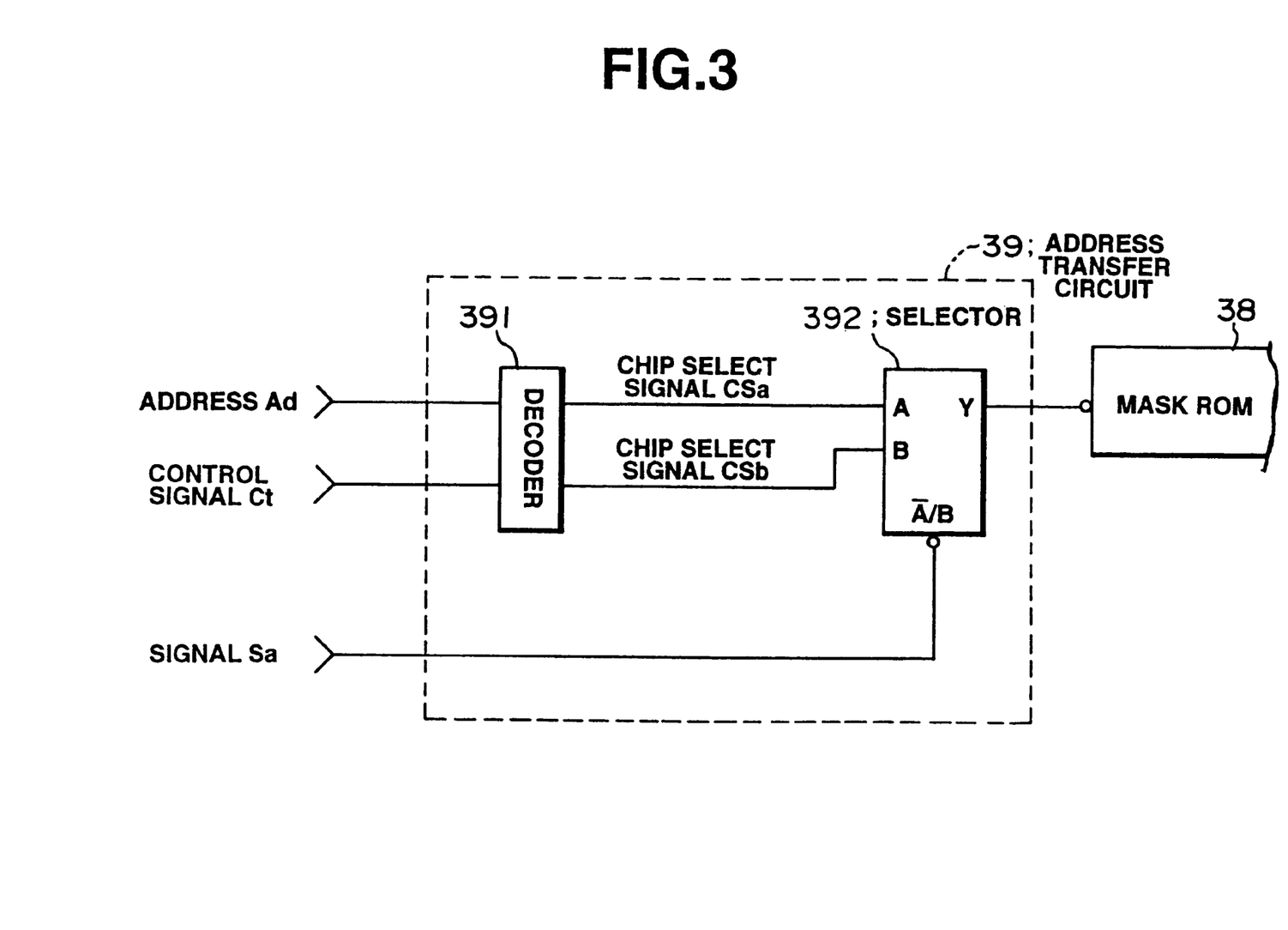
FIG. 3 A block diagram of the address transfer circuit of such embodiment.

FIG. 3 is a circuit diagram indicating an example of the structure of such address transfer circuit 39.

In FIG. 3, address transfer circuit 39 comprises a decoder 391 which forms first chip select signal CSa or second chip select signal CSb based on a certain memory address Ad and a certain memory control signal Ct, and a selector circuit 392 which generates signals for transferring the memory address based on chip select signal CSa, CSb from decoder 391 and signal Sa which indicates the connection of primary cassette 21 with secondary cassette 31, and is constructed as follows.

In decoder 391, the wires are arranged so that address Ad and control signal Ct may be supplied to the decoder. The wiring allows supply of chip select signals CSa, CSb generated by decoder 391 to A, B terminals of selector circuit 392. Further, wires are arranged for supply of signal Sa to selection terminal A/B of selector circuit 392. Also, the output terminal Y of selector circuit 392 is connected to the address transfer terminal of mask ROM 38.

Figures 4A, 4B:
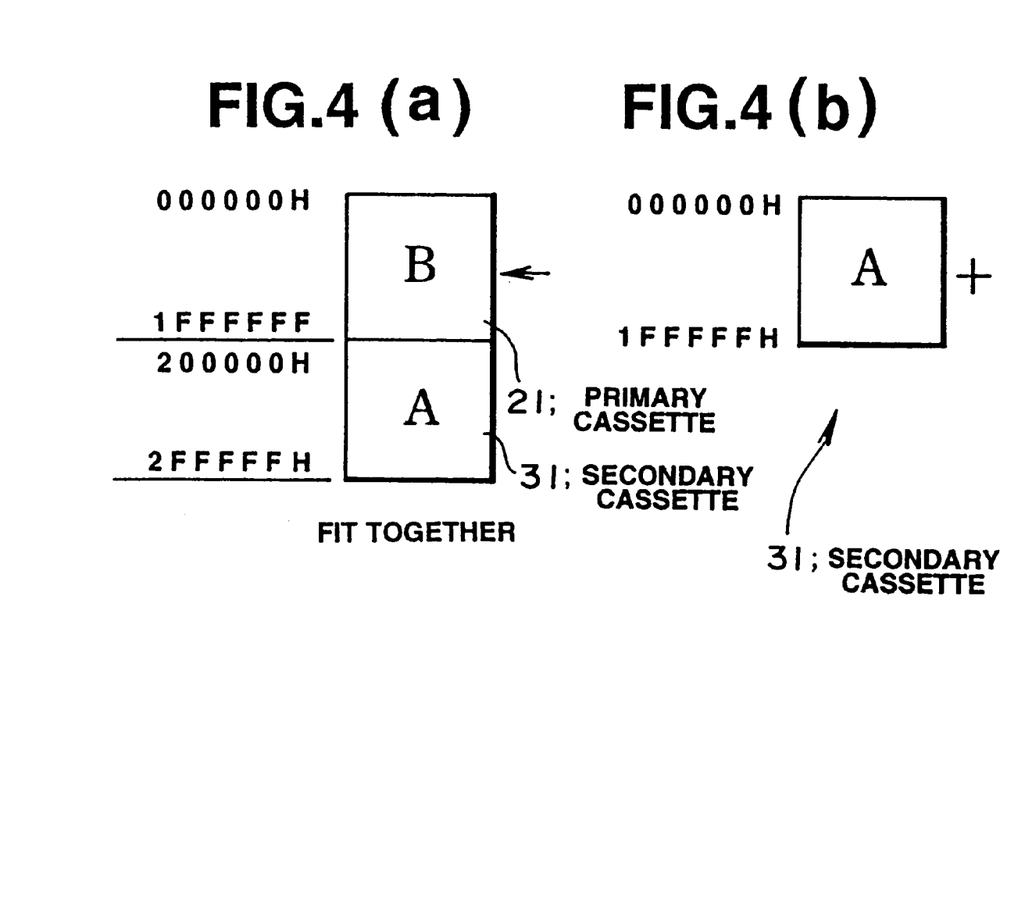
FIG. 4 A view describing the relation between the address values of the primary and secondary memory cassette according to such embodiment, respectively, and the address value when both cassettes are fitted together.
Figure 5:
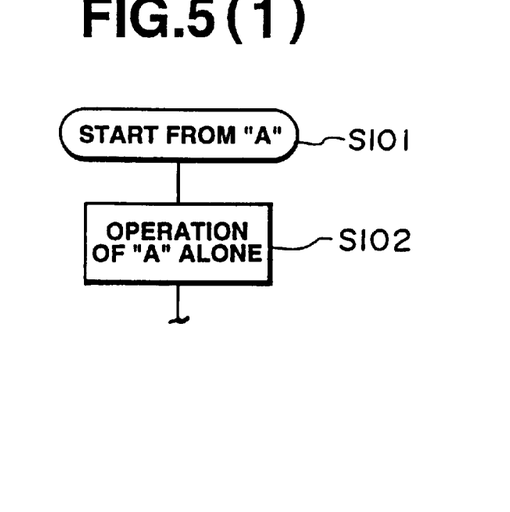
FIG. 5 A flow chart describing the operation of the game machine body according to such embodiment.
Figure 6:
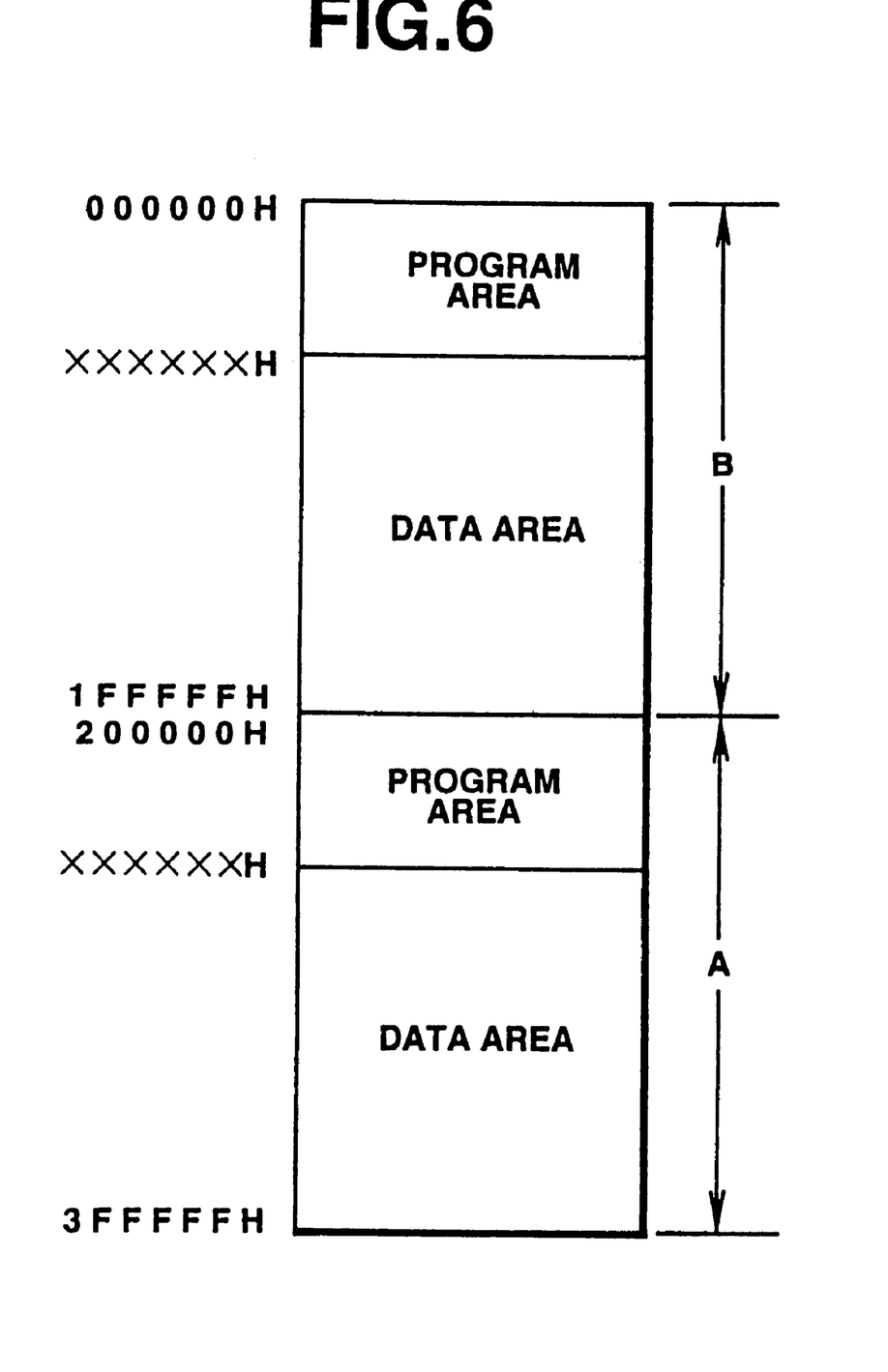
FIG. 6 A view describing the memory map when both cassettes according to such embodiment are fitted together.

Now, the operations of such embodiment will be described with reference to FIGS. 4–6 based on FIGS. 1–3. FIG. 4 indicates the operation when primary and secondary memory cassette are fitted together, and describes the relation between the individual address values of the primary and secondary memory cassette, and the address value when both cassettes are fitted together. FIG. 5 (1) is a flow chart for describing the movements when only the secondary memory cassette is connected to the game machine body, and FIG. 5 (2) is a flow chart for describing the movements when only the primary memory cassette is connected to the game machine body. FIG. 6 describes the memory map when both cassettes are fitted together.

Figure 4C:
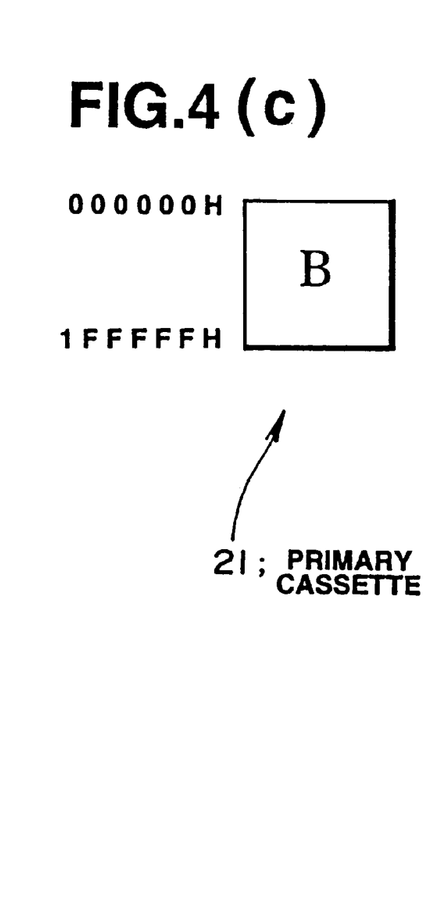

First, as shown in FIG. 4(c), primary memory cassette 21 normally stores its program data B from address 00000H (H indicates the hexadecimal system) to 1FFFFH. In the same way, as shown in FIG. 4(b), secondary memory cassette 31 normally stores its program data A from address 00000H to 1FFFFH.

The installation of only primary memory cassette 21 in game machine body 11 as shown by arrow X results in a state in which game machine body 11 and primary memory cassette 21 are electrically connected via connector 12 and connector 22. When in this state power source is input by turning switch 13 of game machine body 11 on, game machine body 11 principally commences with address 0000H and processes 10 the necessary program data, etc. (FIG. 5 (2) Step 200), and immediately judges the existence of any program data, etc. at and after address 20000H (Step 201). This judgment is conducted as follows. Assuming the output of game machine body 11 of address Ad is 200000H and predetermined control signal Ct is output, one only needs to judge whether any information may be obtained as data Dt.

In this case, even if address Ad and control signal Ct as above are input to mask ROM 28, no data are output from mask ROM 28 to data Dt. Therefore, game machine body 11 judges that program data do not exist at and after address 200000H (FIG. 5 (2) Step 201; NO), so it will operate using only the program data B stored from address 00000H to address 1FFFFH of primary memory cassette 21 (FIG. 5 (2) Step 202).

In the same way, when installing only secondary cassette 31 in game machine body 11 as shown by arrow Y (FIG. 1), a state is provided so that game machine body 11 and secondary memory cassette 31 are electrically connected via connector 12 and connector 32. In this state, when power flows by turning switch 13 of game machine body 11 on (FIG. 5 (1) Step 101), game machine body 11 will operate only with program data A stored from 00000H to 1FFFFFH of "secondary cassette 3" (FIG. 5 (1) Step 102).

Next, primary memory cassette 21 is installed in game machine body 11 as shown by arrow X in FIG. 1, and additionally, secondary memory cassette 31 is installed on primary memory cassette 21 as shown by arrow Z. In this case, game machine body 11 and primary memory cassette 21 are electrically connected via connector 12 and connector 22, and primary memory cassette 21 and secondary memory cassette 31 are electrically connected via connector 24 and connector 32.

Now, when switch 13 of game machine body 11 is switched on and power flows through, signal Sa indicating connection state becomes "L," given to address transfer circuit 39 of secondary memory cassette 31 via connector 24 and connector 32. Game machine body 11 processes here the necessary program data (vector) commencing basically with the execution from address 0000H (Step 200).

Thereby, game machine body 11 judges whether there is any program data from address 200000H and onwards (Step 201). Therefor, game machine body 11 makes address Ad to addresses from 200000H on, gives control signal Ct, and judges whether there is any information as data Dt.

When address Ad and control signal Ct are input to address transfer circuit 39, address transfer circuit 39 is based on address Ad and control signal Ct and forms chip select signal CSb with decoder 391. The chip select signal CSb is given to mask ROM 38 via select circuit 392, as signal Sa indicating connection state indicates "L."

Thereby, the address of mask ROM 38 is transferred from 200000H to 2FFFFFH. Then, when primary memory cassette 21 and secondary memory cassette 31 are fitted together, the address of mask ROM 28 of primary memory cassette 21 is, as shown in FIG. 4(a) and FIG. 6, still from 00000H to 1FFFFFH, but the address of mask ROM 38 of secondary memory cassette 31 is allotted from 200000H to 2FFFFFH.

As the address of secondary memory cassette 31 has been transferred as above, the designation of an address from 200000H onwards by game machine body 11 leads to the output of information of such address from mask ROM 38 to the data wires.

In other words, when game machine body 11 finds some kind of information at the designated address in Step 201, it determines that program data exists at and after address 200000H (Step 201; YES), and, thereafter, game machine body 11 operates using program data B stored from address 00000H to 1FFFFFH in primary memory cassette 21 and program data A stored from address 200000H to 3FFFFFH in secondary memory cassette 31 (Step 203).

In other words, when game machine body 11 judges that primary memory cassette 21 and secondary memory cassette 31 have been fitted together, it can access these freely, as described above.

Further, in such state where primary memory cassette 21 and secondary memory cassette 31 are fitted together, the program area exists from 00000H to xxxxxH, and the data area exists from xxxxxxH to 1FFFFF in primary memory cassette 21, as indicated in FIG. 6. At the secondary memory cassette 31, the program area exists from 200000H to xxxxxH and the data area from xxxxxxH to 3FFFFF, as indicated in FIG. 6.

According to the embodiment above, it is possible to use primary memory cassette 21 and secondary memory cassette 31 alone or fitted (connected) together, satisfying various demands for the development of a variety of games. Further, as two memory cassettes may be used at the same time, a large amount of program capacity may be used. Moreover, by installing a secondary memory cassette on the primary memory cassette, old games can be used again, providing the advantage of effectively using the development steps for the games, the ROM and other resources.

Figure 7:
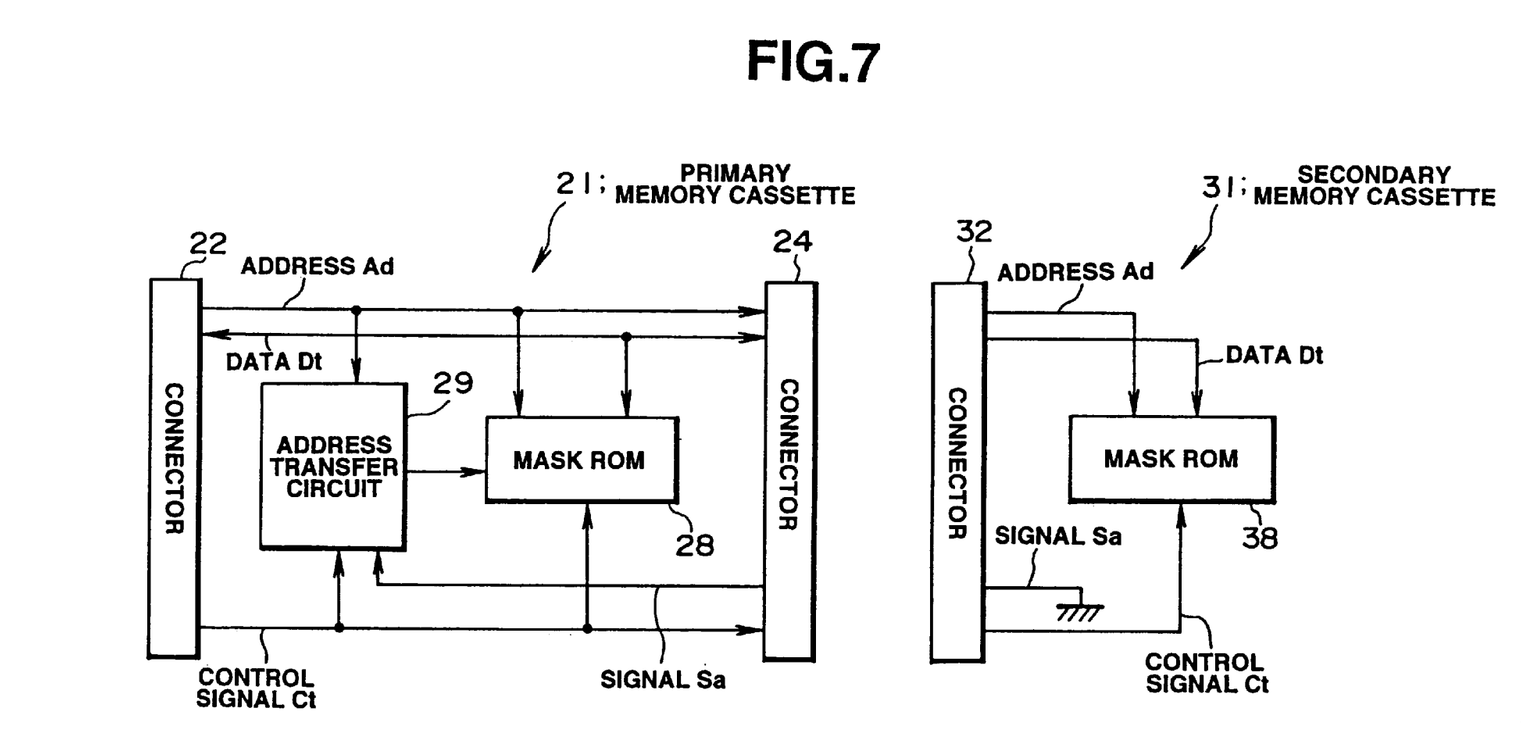
FIG. 7 A view of another construction of the primary and secondary memory cassettes according to such embodiment.

FIG. 7 shows another exemplary construction of a primary and secondary memory cassette used in an embodiment of the present invention. Same composing elements in FIG. 7 as in FIG. 2 are indicated by identical reference numbers.

The circuit system of primary memory cassette 21 comprises connector 22, connector 24, mask ROM 28 and address transfer circuit 29 as the circuit judging the connection state, and the wires with the same pin numbers at connector 22 and 24 are connected as signal wires for address Ad, data Dt and control signal Ct. The wiring for such address Ad, data Dt and control signal Ct is constructed such to be connected to mask ROM 28.

Further, address Ad and control signal Ct and signal Sa are connected to a predetermined electrode of address transfer circuit 29, and the address transfer signals generated by this address transfer circuit 29 are supplied to the address changing input terminal of mask ROM 28. The address transfer circuit 29 has the same circuit construction as address transfer circuit 39 shown in FIG. 3.

Further, the circuit system of secondary memory cassette 31 comprises connector 32 and mask ROM 38. Address Ad, data Dt and controls signal Ct of such connector 32 with predetermined pin numbers, which have the predetermined pin numbers of connector 32 to be connected to predetermined pins of mask ROM 38, is constructed such to be connected to the grounding electrode.

Figure 8:
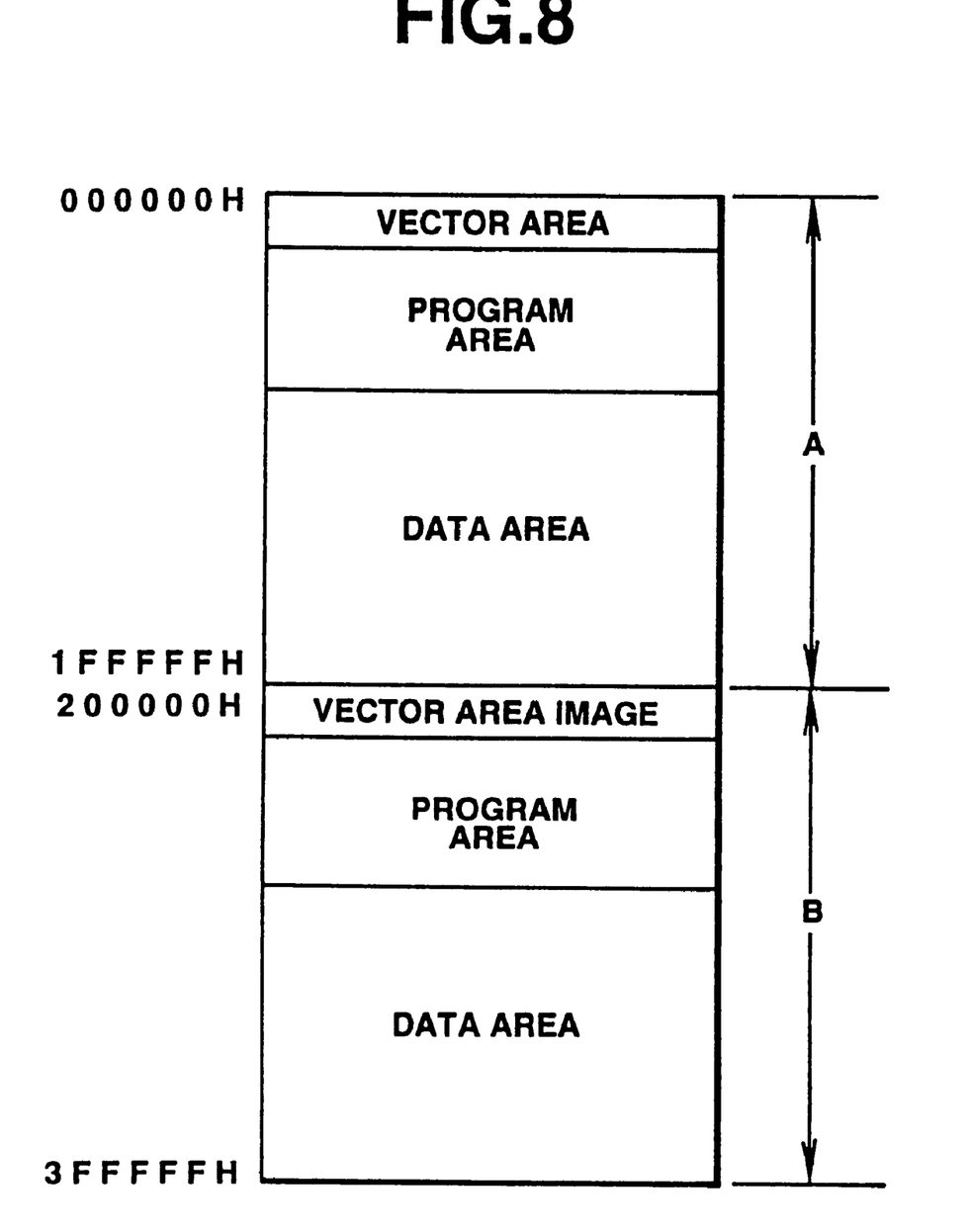
FIG. 8 A view describing the memory map when both cassettes according to such embodiment are fitted together.

The operations of this embodiment will be explained with reference to FIGS. 5, 8 based on FIGS. 1, 3 and 7. FIG. 8 explains the memory map when both cassettes are fitted together.

First, primary memory cassette 21 and secondary memory cassette 31 individually store program data B and A from address 00000H to 1FFFFH alone, as described above.

Then, when only secondary memory cassette 31 is installed in game machine body 11 as shown by arrow Y (FIG. 1), then game machine body 11 will, as described above, operate based only on program data A stored from 00000H to 1FFFFFH of "secondary memory cassette 31" (FIG. 5, Step 101, 102).

In the same way, when only primary memory cassette 21 is installed in game machine body 11 as shown by arrow X (FIG. 1), game machine body will, as described above, commence with then operation from address 00000H and process the necessary program data (Step 200), then immediately judge the existence of program data from address 200000H on (Step 201), and operate based only on program data B stored from address 00000H to 1FFFFH (Step 202).

Next, primary memory cassette 21 is installed in game machine body 11 in accordance with arrow X, and further, secondary memory cassette 31 is installed on primary memory cassette 21 in accordance with arrow Z. In this case, game machine body 11 and primary memory cassette 21 are electrically connected via connector 12 and connector 22, and, further, primary memory cassette 21 and secondary memory cassette 31 are electrically connected via connector 24 and connector 32. In this state, power flows through by switching switch 13 of game machine body 11 to on, signal Sa indicating connection state becomes "L" and this signal Sa is given to address transfer circuit 29 of primary memory cassette 21 via connector 32 and connector 24.

Accordingly, when game machine body 11 outputs control signal Ct by using address Ad at and after address 200000H, address transfer signals are output from address transfer circuit 29 to mask ROM 28. Through this address transfer signal, the address of mask ROM 28 is transferred and the address of mask ROM 28 moves from 200000H to 3FFFFFH, as shown in FIG. 8. At this point, game machine body 11 processes the necessary program data (vector) by commencing basically with the operation from 0000H, but by compulsorily transferring the vector of primary memory cassette 21 to address 00000H of secondary memory cassette 31, it is possible continue operating program A of secondary memory cassette 31.

Then, game machine body 11 judges the existence of programs at address 200000H and onwards (Step 201; YES). This judgment is made by determining whether information is output at data Dt when address Ad from address 200000H on is output and control signal Ct is output. When such address Ad and control signal Ct is input to address transfer circuit 29, address transfer circuit 29 generates chip select signals based on address Ad and control signal Ct, generates address transfer signals from these chip select signals and signal Sa indicating connection state ("L,") and gives this to mask ROM 28.

Thereby, as the address allotted to mask ROM 28 is transferred from 200000H to 3FFFFFH, the fitting together of primary memory cassette 21 and secondary memory cassette 31 results in the address of mask ROM 28 of primary memory cassette 21 being transferred from 200000H to 3FFFFFH, and that of mask ROM 38 of secondary memory cassette 31 from 00000H to 1FFFFFH, as indicated in FIG. 8. As the address of primary memory cassette 21 has been transferred as above, the designation of an address at 200000H and onwards by game machine body 11, the information of such address is output from mask ROM 28 to data Dt.

Therefore, at game machine body 11, when information is acquired at a certain address as above, the judgment is that there is program data at 200000H and onwards (Step 201; YES), and afterwards, game machine body 11 will operate by using both the program data B stored from address 200000H to 3FFFFFH in primary memory cassette 21, and the program data A stored from 200000H to 3FFFFFH in secondary memory cassette 31 (Step 203). In other words, game machine body 11 may, as described above, access both cassettes freely when it has judged that both primary memory cassette 21 and secondary memory cassette 31 have been installed.

Further, in such state of installed primary memory cassette 21 and secondary memory cassette 31, primary memory cassette 21 has, as shown in FIG. 8, its program area from address 200000H to xxxxxxH, and its data area from xxxxxxH to 3FFFFF. Secondary memory cassette 31 has, as shown in FIG. 8, its program area from 00000H to xxxxxH, and its data area from xxxxxH to 1FFFFF.

Figure 9:
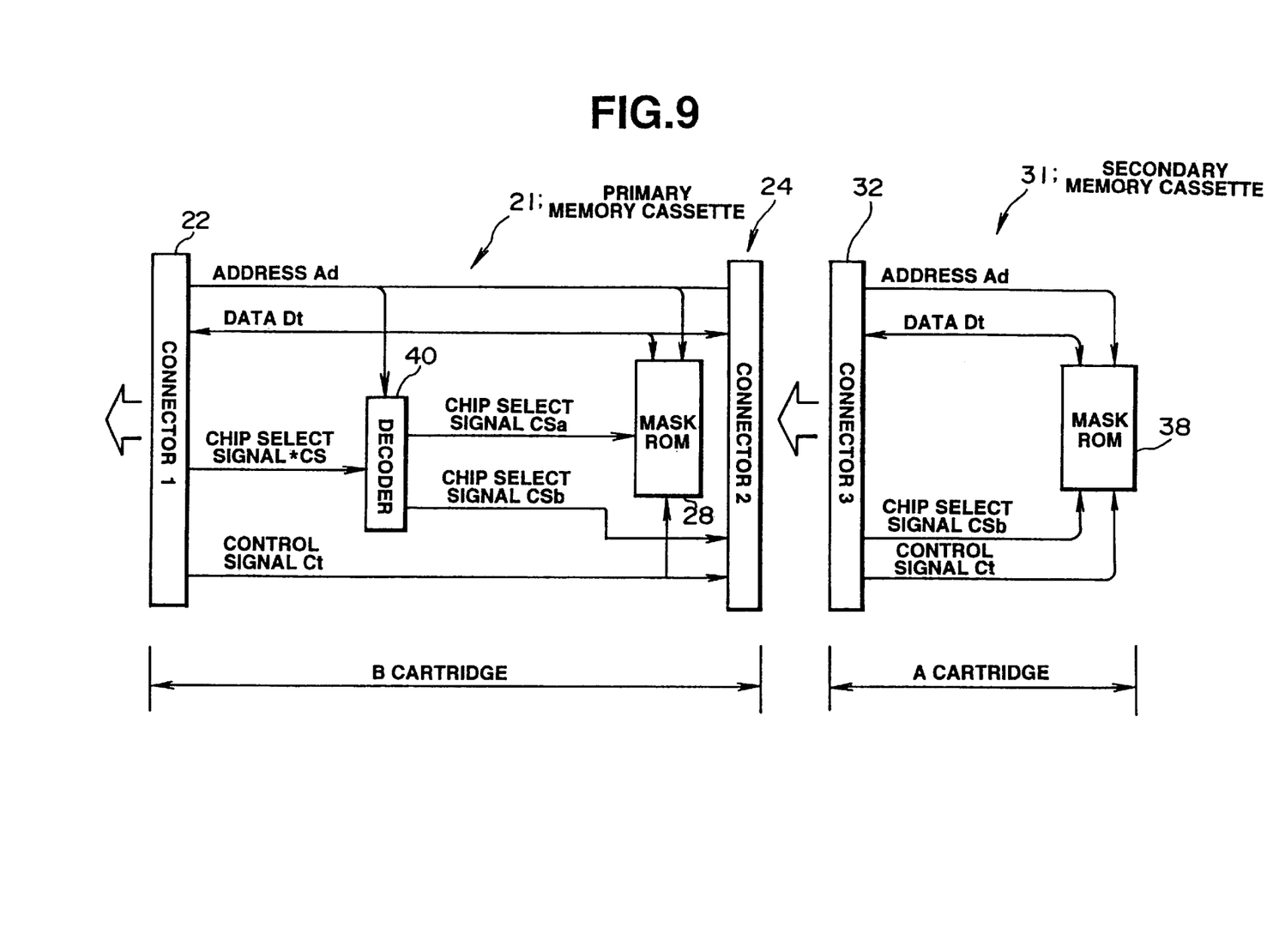
FIG. 9 A view describing the primary and secondary memory cassette according to such embodiment.

FIG. 9 illustrates another embodiment of the primary and secondary memory cassette used in the present invention. The embodiment of FIG. 9 differs from that of FIG. 7 in that chip select signal *Cs (* indicates the inversion of CS) is supplied from game machine body 11 to decoder 40 via connector 22, and a predetermined address is supplied to decoder 40. Another difference to the embodiment of FIG. 7 is that chip select signal CSa and chip select signal CSb is generated by decoder 40, and the electric wiring is arranged so that such chip select signal CSa is supplied to mask ROM 28 and chip select signal CSb is supplied to mask ROM 38 of secondary memory cassette 31 via the predetermined pin number portion of connector 24 and the same pin number portion of connector 32. The other construction is the same as in FIG. 7. The same reference numbers are attached to the portions which are identical in FIG. 9 and FIG. 7.

Figure 10:
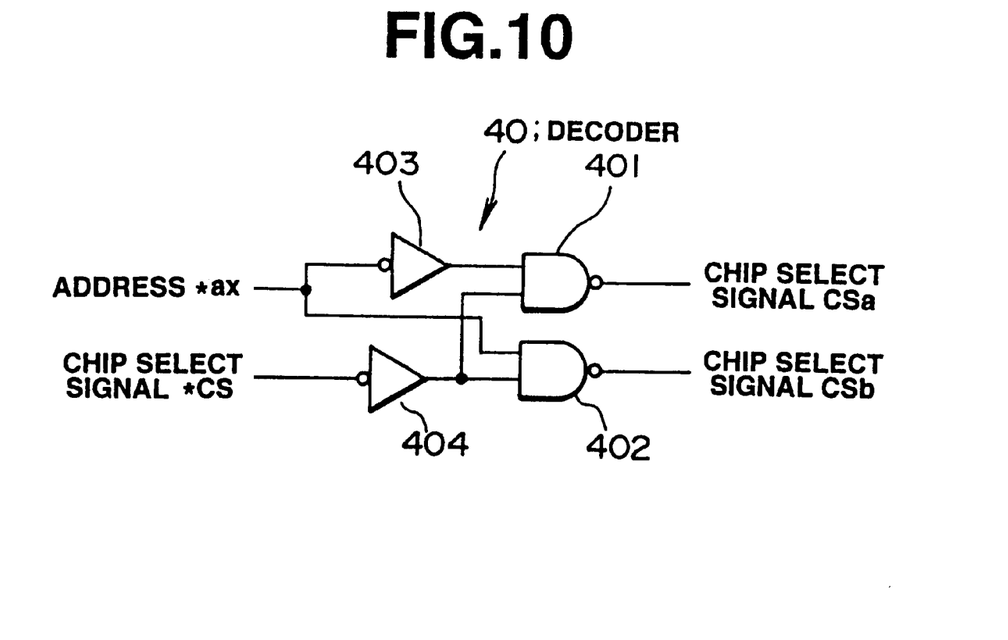
FIG. 10 A block view of the decoder circuit according to such embodiment.

FIG. 10 is a view of a circuit indicating an example of the concrete construction of the decoder. As shown in FIG. 10, decoder 40 is composed of two NAND circuits 401, 402 and two inverted circuits 403, 404, and has the following connection state. An electric connection allows address *ax (in this case, * indicates the inversion of ax) to be directly given to one input terminal of NAND circuit 401 and one input terminal of NAND circuit 402 via inverted circuit 403. Further, an electric connection allows chip select signal *CS sent from game machine body 11 via connector 12 and connector 22 of primary memory cassette 21 to be input to the other input terminals of NAND circuits 401, 402 via inverted circuit 404.

Chip select signal CSa is output from the output terminal of NAND circuit 401, and chip select signal CSb is output from the output terminal of NAND circuit 402, respectively.

This embodiment allows the single or joint use of primary memory cassette 21 and secondary memory cassette 31, satisfying demands for development of a variety of games. Further, the use of two memory cassettes allows the use of a large program capacity. It also has the advantage of using the steps of development, ROM and other resources of such game effectively, as it is possible to use old games again.

Figure 11:
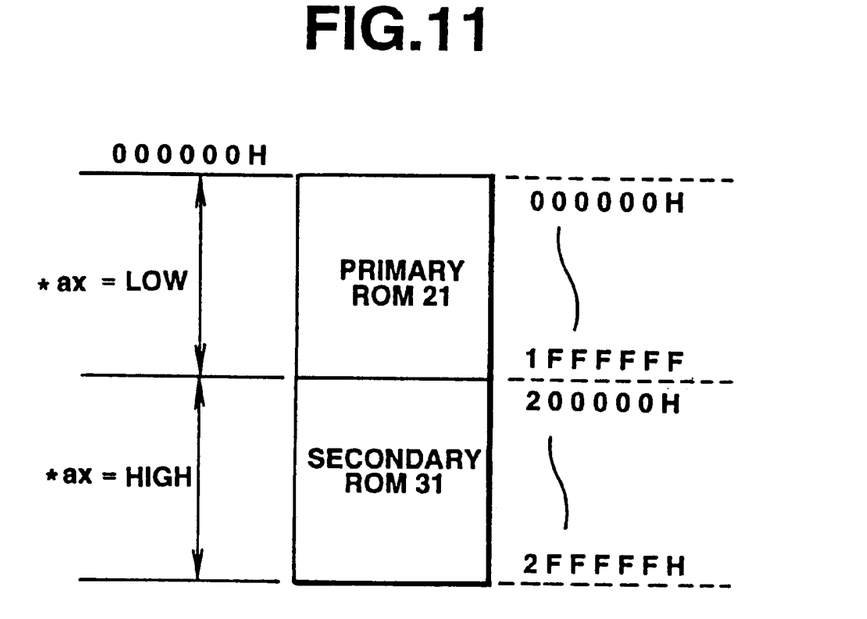
FIG. 11 A view describing the memory map of each of the memory cassettes according to such embodiment.
Figure 12:
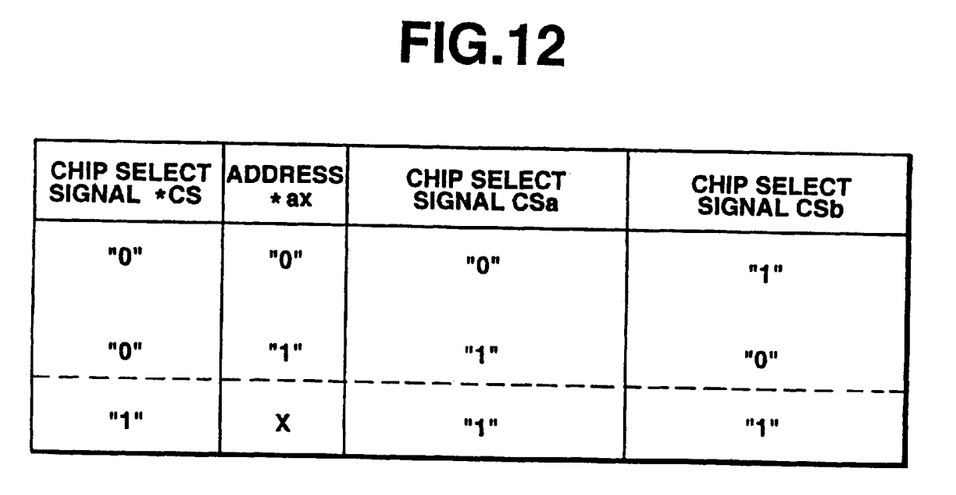
FIG. 12 A view describing the operation of the embodiment according to the present invention.

This embodiment will be explained in detail with reference to FIGS. 9, 10, 11 and 12. FIG. 11 describes the memory map arranged by the embodiment of FIG. 9. FIG. 12 is an explanation for using the operation of such embodiment.

Game machine body 11 can output address *ax used for switching of primary memory cassette 21 or secondary memory cassette 31, and can also output chip select signal *CS.

In this state, as shown in FIG. 12, when address *ax is "L" ("0"), and chip select signal *CS output from game machine body 11 is "L" ("0"), both input terminals of NAND circuit 401 become "H" ("1."). Thereby, the output of NAND circuit 401 becomes "L" ("0."). As one input terminal of NAND circuit 402 is "L" ("0,") the output of NAND circuit 402 becomes "H" ("1.").

In other words, chip select signal CSa will be output from decoder 40. Thereby, game machine body 11 will use the programs, etc. stored in primary memory cassette 21. This leads to the use of addresses 00000H to 1FFFFFH in primary memory cassette 21, as shown in FIG. 11. In this case, regardless of whether primary memory cassette 21 is installed in game machine body 11 alone or whether a secondary memory cassette 31 is installed on (fitted together with) primary memory cassette 21 installed in game machine body 11, game machine body 11 will use the programs in primary memory cassette 21.

On the other hand, as shown in FIG. 12, if a certain address *ax (in this case, using for example the 6th data Dt in 200000H) becomes "H" ("1,") and chip select signal *CS output from game machine body 11 becomes "L" ("0,") both input terminals of NAND circuit 402 become "H" ("1,") so that the output of NAND circuit 402 becomes "L" ("0."). Further, as one input terminal of NAND circuit 401 is "L" ("0,") the output of NAND circuit 401 becomes "H" ("1."). Then, chip select CSb will be output from decoder 40.

This leads to game machine body 11 being unable to access with primary memory cassette 21, only being able to access with secondary memory cassette 31. Then, address Ad is from 200000H to 3FFFFFH, so that game machine body 11 is able to use the programs, etc. stored in secondary memory cassette 31. As shown in FIG. 11, hereby used is the address of secondary memory cassette 31 which has been transferred from 200000H to 3FFFFFH.

Further, when chip select signal *CS is "H" ("1,") the output terminals of NAND circuits 401, 402 of decoder 40 will both output "H" ("1,") regardless of the value of address *ax, so that both primary memory cassette 21 and secondary memory cassette 31 are not accessible.

Further, the installation of secondary memory cassette 31 alone in game machine body 11 leads to input of chip select signal *CS directly to mask ROM 38 of secondary memory cassette 31, so that secondary memory cassette 31 will use the addresses from 00000H to 1FFFFFH.

According to this embodiment, primary memory cassette 21 and secondary memory cassette 31 are used alone or jointly, satisfying demands for a variety of game developments. Further, as two memory cassettes can be used, a large program capacity can be used. Further, as it is possible to use old games again, there is the advantage that the steps of development, ROM and other resources of such game are used effectively.

Further, in the present embodiment, the circuit for judging the connection state may be provided at the game machine body, i.e. at the side of the processing device body, too.

What is claimed is:

1. A video game memory cassette apparatus comprising:
    a processing device for transmitting an address signal to a connected memory cassette, the processing device having a processor and a first cnnnector;
    a primary memory cassette having a primary menory for storing data such that the data is identified by a first range of memory addresses of the primary memory, the primary memory cassette having a second connector for connecting to the first connector, and a third connector;
    a secondary memory cassette having a secondary memory for storing data such that the data is identified by a first range of memory addresses of equal value to the first range of memory addresses of the primary memory, the secondary memory cassette having a fourth connector for connecting to, one at a time, the first connector and the third connector; and
    a connection state judging circuit for determining that the first connector is connected to the second connector and that the fourth connector is simultaneously connected to the third connector;
    wherein, in a first state, the first connector is connected to one of the second connector and the fourth connector;
    wherein, in a second state, the first connector is connected to the second connector and the third connector is connected to the fourth connector.

2. The apparatus of claim 1 wherein, in the first state, an address signal is transmitted from the processing device to the connected memory cassette and, in response thereto, data identified by the first range of memory addresses of the connected memory cassette memory is output to the processing device.

3. The apparatus of claim 1 wherein, in the second state:
    a. an address signal from the processing device is transmitted to the connection state judging circuit;
    b. the connection state judging circuit generates an address transfer signal in response to the address signal;
    c. in response to the address signal, data identified by the first range of memory addresses of the primary memory cassette is output to the processing device;
    d. in response to the address transfer signal, the memory addresses identifing the data of the secondary memory are shifted to a second range of memory addresses, the second range not equal in value to the first range, and data identified by the second range of memory addresses is output from the second memory cassette to the processing device.

4. The apparatus of claim 1, wherein the fourth connector comprises a plurality of pins.

5. The apparatus of claim 4, wherein one predetermined pin of the plurality of pins provides signal logic to the connection state judging circuit to indicate whether the fourth connector is connected to the third connector.

6. The apparatus of claim 1, wherein the connection state judging circuit is formed as a part of the primary memory cassette.

7. The apparatus of claim 1, wherein the connection state judging circuit is formed as a part of the secondary memory cassette.

8. The apparatus of claim 1, wherein the connection state judging circuit comprises a decoder and a selector circuit.

9. A method for enhancing video game memory comprising the steps of:
    providing a processing device having a processor for transmitting an address signal to a connected memory cassette, the processing device having a first connector;
    storing data in a primary memory of a primary memory cassette such that the data is identified by a first range of memory addresses of the primary memory, the primary memory cassette having a second connector for connecting to the first connector, and a third connector;
    storing data in a secondary memory of a secondary memory cassette such that the data is identified by a first range of memory addresses of equal value to the first range of memory addresses of the primary memory, the secondary memory cassette having a fourth connector for connecting to, one at a time, the first connector and the third connector; and determining, using a connection state judging circuit that the first connector is connected to the second connector and that the fourth connector is simultaneously connected to the third connector;

wherein, in a first state, the first connector is connected to one of the second connector and the fourth connector;

wherein, in a second state, the first connector is connected to the second connector and the third connector is connected to the fourth connector.

10. The method of claim 9 wherein, in the first state, the method further comprises the steps of:

transmitting an address signal from the processing device to the connected memory cassette; and outputting data identified by the first range of memory addresses of the connected memory cassette memory to the processing device in response to the transmitting of the address signal.

11. The method of claim 9 wherein, in the second state, the method further comprises the steps of:

the processing device transmitting an address signal to the connection state judging circuit;

the connection state judging circuit generating an address transfer signal in response to the address signal;

outputting data identified by the first range of memory addresses of the primary memory cassette to the processing device in response to the address signal;

shifting the memory addresses identifying the data of the secondary memory to a second range of memory addresses in response to the address transfer signal, the second range not equal in value to the first range; and outputting data identified by the second range of memory addresses of the secondary memory cassette to the processing device.

12. The method of claim 9, wherein the fourth connector comprises a plurality of pins.

13. The method of claim 12 further comprising the step of providing signal logic on one predetermined pin of the plurality of pins to the connection state judging circuit to indicate whether the fourth connector is connected to the third connector.

14. The method of claim 9, further comprising the step of forming the connection state judging circuit as a part of the primary memory cassette.

15. The method of claim 9, further comprising the step of forming the connection state judging circuit as a part of the secondary memory cassette.

\* \* \* \* \*